(12) United States Patent
Caruso et al.

(10) Patent No.: US 10,361,674 B2
(45) Date of Patent: Jul. 23, 2019

(54) RADIO FREQUENCY DELAY LINE

(71) Applicants: Infineon Technologies AG, Neuibiberg (DE); Universitá di Padova Dipartimento di Ingegneria dell'Informazione (DEI), Padua (IT)

(72) Inventors: Michele Caruso, Villach (AT); Andrea Bevilacqua, Padua (IT)

(73) Assignees: Infineon Technologies AG, Neubiberg (DE); UNIVERSITA DI PADOVA DIPARTIMENTO DI INGEGNERIA DELL'INFORMAZIONE (DEI), Padua (IT)

( * ) Notice: Subject to any disclaimer, the term of this patent is extended or adjusted under 35 U.S.C. 154(b) by 236 days.

(21) Appl. No.: 15/404,256

(22) Filed: Jan. 12, 2017

(65) Prior Publication Data

US 2018/0198434 A1   Jul. 12, 2018

(51) Int. Cl.
   *H03H 7/32*   (2006.01)
   *H03H 7/09*   (2006.01)
(52) U.S. Cl.
   CPC .............. *H03H 7/325* (2013.01); *H03H 7/09* (2013.01)
(58) Field of Classification Search
   CPC ................................. H03H 7/325; H03H 7/09
   USPC ........................................................ 333/138
   See application file for complete search history.

(56) References Cited

U.S. PATENT DOCUMENTS

| 3,882,431 A * | 5/1975 | Hopwood | H01Q 3/38 |
| | | | 327/493 |
| 2009/0195328 A1 | 8/2009 | Nakamura | |
| 2015/0249445 A1* | 9/2015 | Dong | H03K 5/159 |
| | | | 341/143 |

FOREIGN PATENT DOCUMENTS

DE   102008034121 A1   1/2009

OTHER PUBLICATIONS

Analui et al., "Statistical Analysis of Integrated Passive Delay Lines", Custom Integrated Circuits Conference, 2003. Proceedings of the IEEE 2003, pp. 107-110.*
Matt Longbrake, "True Time-Delay Beamsteering for Radar", Wright State University Air Force Research Laboratory Sensors Directorate, Dayton, OH, 2012.
D. Carosi et al., "Delay Control in Wide Band Front-End Components for Multi-role/Multi-domain Phased-Array Systems", IEEE IMS Symposium, Jun. 2011.
Qian Ma et al., "A 10-50GHz True-Time-Delay Phase Shifter with max 3.9% delay variation", RFIC2014, Jun. 2014.

(Continued)

*Primary Examiner* — Benny T Lee
*Assistant Examiner* — Hafizur Rahman
(74) *Attorney, Agent, or Firm* — Viering, Jentschura & Partner MBB (57) ABSTRACT

According to an embodiment, a radio frequency delay line is described comprising a first conductor comprising a plurality of first inductors, a second conductor comprising a plurality of second inductors, wherein each of the plurality first inductors corresponds to a respective one of the plurality of second inductors and a plurality of inductor pairs, each inductor pair comprising a first inductor and the corresponding second inductor. For each of the plurality of inductor pairs, the first inductor and the corresponding second inductor are arranged so that an inductor area of the first inductor overlaps with an inductor area of the corresponding second inductor.

22 Claims, 11 Drawing Sheets

(56) References Cited

OTHER PUBLICATIONS

Qian Ma et al., "Silicon-Based True-Time-Delay Phased-Array Front-Ends at Ka-Band", IEEE Transactions on Microwave Theory and Techniques, Sep. 2015, vol. 63, No. 9.
Amit. S. Nagra et al., "Disctributed Analog Phase Shifters with Low Insertion Loss", IEEE Transactions on Microwave Theory and Techniques, Sep. 1999, vol. 47, No. 9.
German Office Action based on Application No. 10 2018 100 453.2 (8 pages) dated Apr. 5, 2019 (for reference purpose only).

* cited by examiner

RADIO FREQUENCY DELAY LINE

TECHNICAL FIELD

The present disclosure relates to radio frequency delay lines.

BACKGROUND

To increase the throughput in cellular communication systems, the usage of millimeter (mm) wave signals for radio transmission is considered. Since millimeter wave signals are typically more vulnerable to propagation loss than radio signals of longer wavelengths, the usage of directional antennas, i.e. beam forming, is considered, which however requires a plurality of antennas and correspondingly a plurality of circuits which need to handle different delays. Approaches allowing an efficient implementation of such circuits are desirable.

SUMMARY

According to an embodiment, a radio frequency delay line is provided comprising a first conductor comprising a plurality of first inductors, a second conductor comprising a plurality of second inductors, wherein each of the plurality first inductors corresponds to a respective one of the plurality of second inductors and a plurality of inductor pairs, each inductor pair comprising a first inductor and the corresponding second inductor. For each of the plurality of inductor pairs, the first inductor and the corresponding second inductor are arranged so that an inductor area of the first inductor overlaps with an inductor area of the corresponding second inductor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
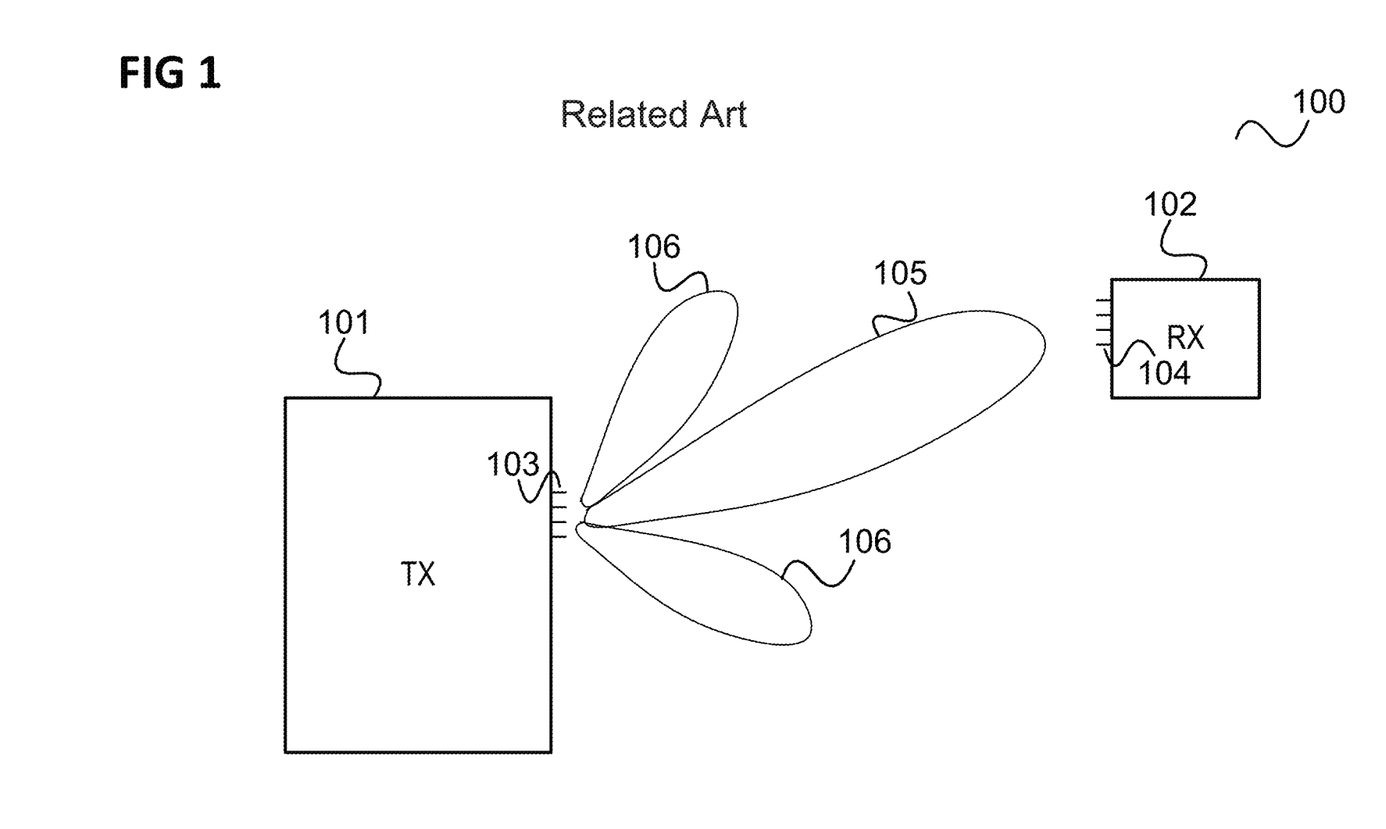
FIG. 1 shows a communication arrangement.

Small wavelengths such as those of millimeter waves allow the creation of small size high directional high gain antennas by means of beam forming as illustrated in FIG. 1.

FIG. 1 shows a communication arrangement 100.

The communication arrangement 100 includes a transmitter 101 and a receiver 102.

The transmitter 101 includes a directional transmit antenna 103 formed of a plurality of antennas (exciter elements) and the receiver 102 includes a directional receive antenna 104 formed of a plurality of antennas, in other words an antenna array. By setting a time delay between the antennas forming transmit antenna 103, the transmitter 101 may perform beam forming for a transmit signal such that the antenna gain strongly depends on the angle under which the transmitter is seen (in other words the signal strength depends on the angle of departure from the transmitter 101). In this example, the gain is very high for the direction of a main lobe 105 (as represented by its size), medium for the direction of side lobes 106 and very small for all other directions. Similarly, the receiver 102 may, by setting a delay shift between the antennas forming the receive antenna 104, perform beam forming to make the receive antenna gain dependent from the angle of arrival of a signal.

Figure 2:
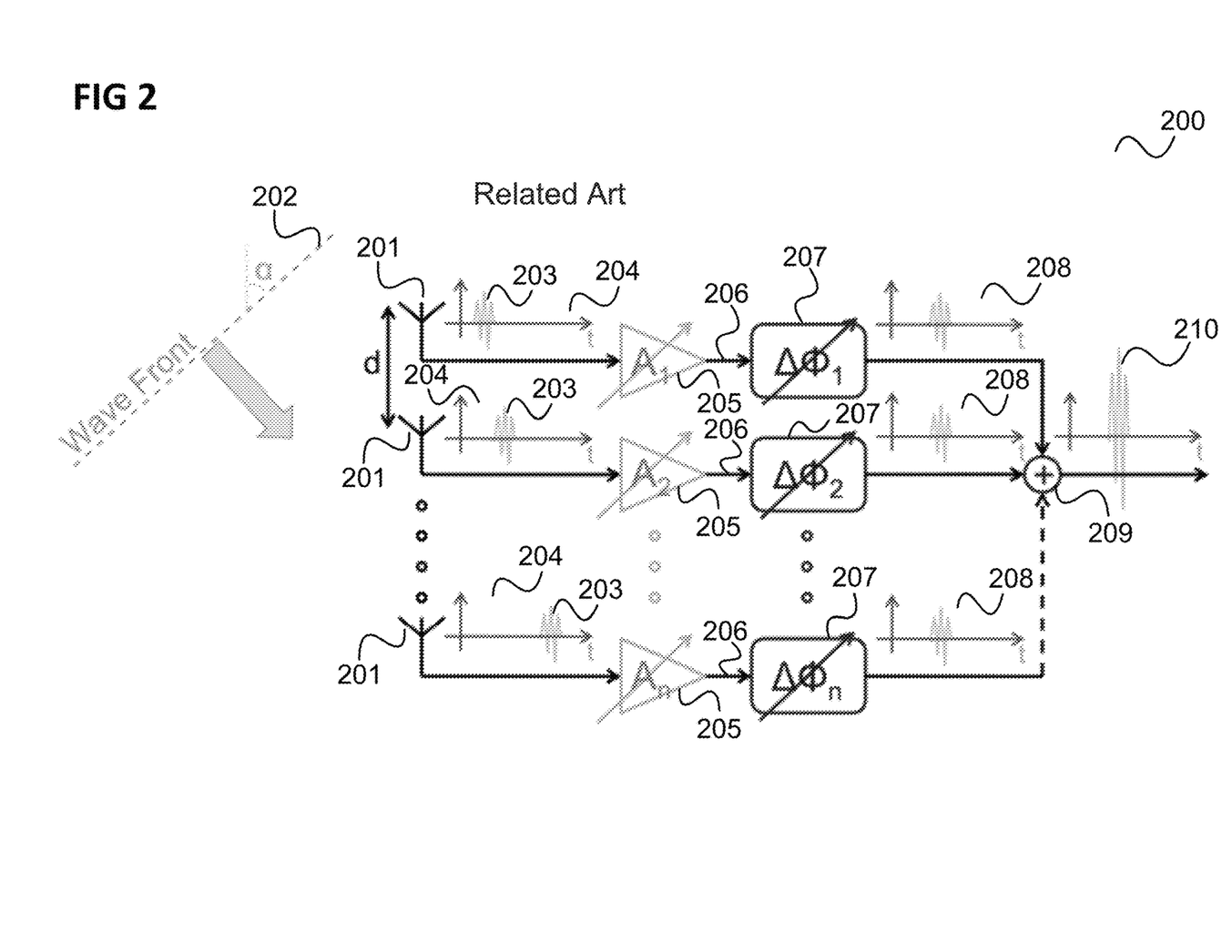
FIG. 2 shows an antenna arrangement of a receiver in a beamforming scenario.

As illustrated in FIG. 1, the wave front of electromagnetic waves sent by the transmitter 101 to the receiver 102 does not arrive in parallel to the antenna array but under a certain angle, as it is illustrated in FIG. 2.

FIG. 2 shows an antenna arrangement 200 of a receiver in a beamforming scenario.

The antenna arrangement 200 comprises a plurality of antennas 201 forming an antenna array, e.g. corresponding to the antennas forming the receive antenna 104 of FIG. 1.

A wave front 202 of electromagnetic waves sent by a transmitter (e.g. transmitter 101) arrives at an angle α to the antenna array. Accordingly, the wave front 202 arrives at the antennas 201 at different times, in the example of FIG. 2 it arrives first at the topmost antenna and arrives last at the bottommost antenna.

Accordingly, a signal 203 conveyed by a radio signal comprising the wave front 203 and received by the antennas is output by the antennas with different delays as illustrated by first time diagrams 204. Each antenna supplies the received signal 203 to a respective amplifier 205 which amplifies the signal 203 and outputs it via a respective differential transmission line 206.

Each transmission line 206 is followed by adjustable delay element 207 which compensates the different delays in the different antenna paths (i.e. for the different antennas) such that at the output of the delay element 207 the (amplified) signal has the same timing for each antenna as illustrated by second time diagrams 208. Since the delay elements 207 may have different losses, the amplifiers 205 are also adjustable to compensate for this differences in the loss.

The delay elements 207 are coupled to adder 209 configured to add the different versions of the signal 203 to an overall signal 210 which is supplied by the antenna arrangement 200 to other components for further processing (e.g. demodulation and baseband processing).

A phased array system, for example, are gaining more and more interest in the radar and communication context. Two different approaches can be followed to change the delay the signal experiences in the different array paths, namely the phase and the time delay approach wherein the time delay is more versatile and applicable in a wideband scenario.

The total relative delay is a function of the number n of antennas 201 in the array, the distance d between them (also referred to as antenna pitch, typically half of the wavelength) and the steering angle α. As an example, for a linear array of n=8, d=15 mm (corresponding to 10 GHz) and a steering angle of ±60 degree, a total delay of ~300 ps is needed for the compensation of the different delays which is difficult to implement in an integrated circuit. This number gets even bigger when considering a multi-dimensional array.

Figure 3:
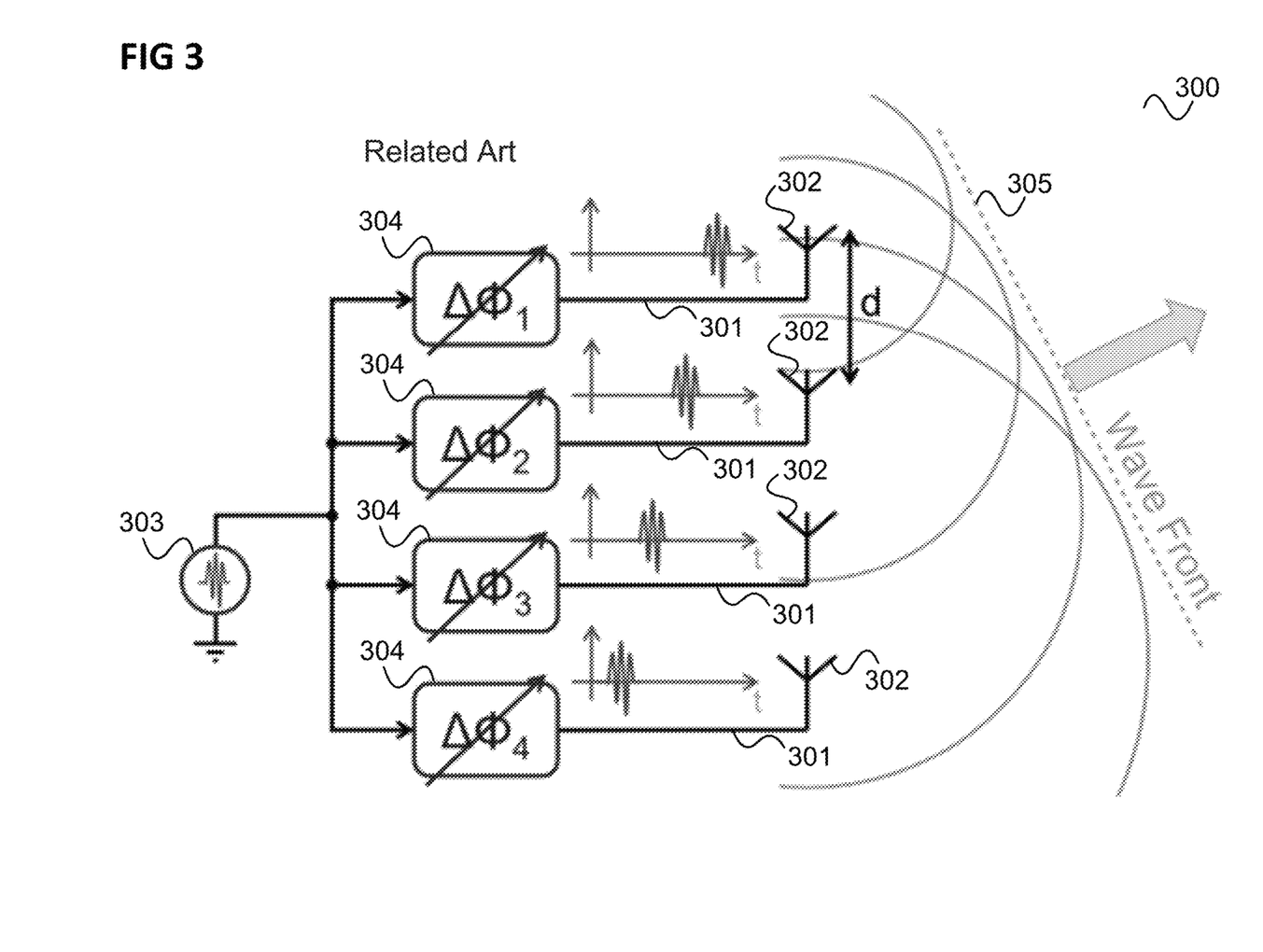
FIG. 3 shows an antenna arrangement for the transmitter side in a beamforming scenario.

FIG. 3 shows an antenna arrangement 300 for the transmitter side.

As on the receiver side illustrated in FIG. 2, the antenna arrangement 300 comprises transmission lines 301 connected to antennas 302 forming an antenna array. A signal source 303 feeds the adjustable delay elements 304 to achieve that a wave front 305 is transmitted at a certain angle from the antenna array. A variable amplifier may be useful to adjust for different losses and to reach the desired sidelobe suppression.

Figure 4:
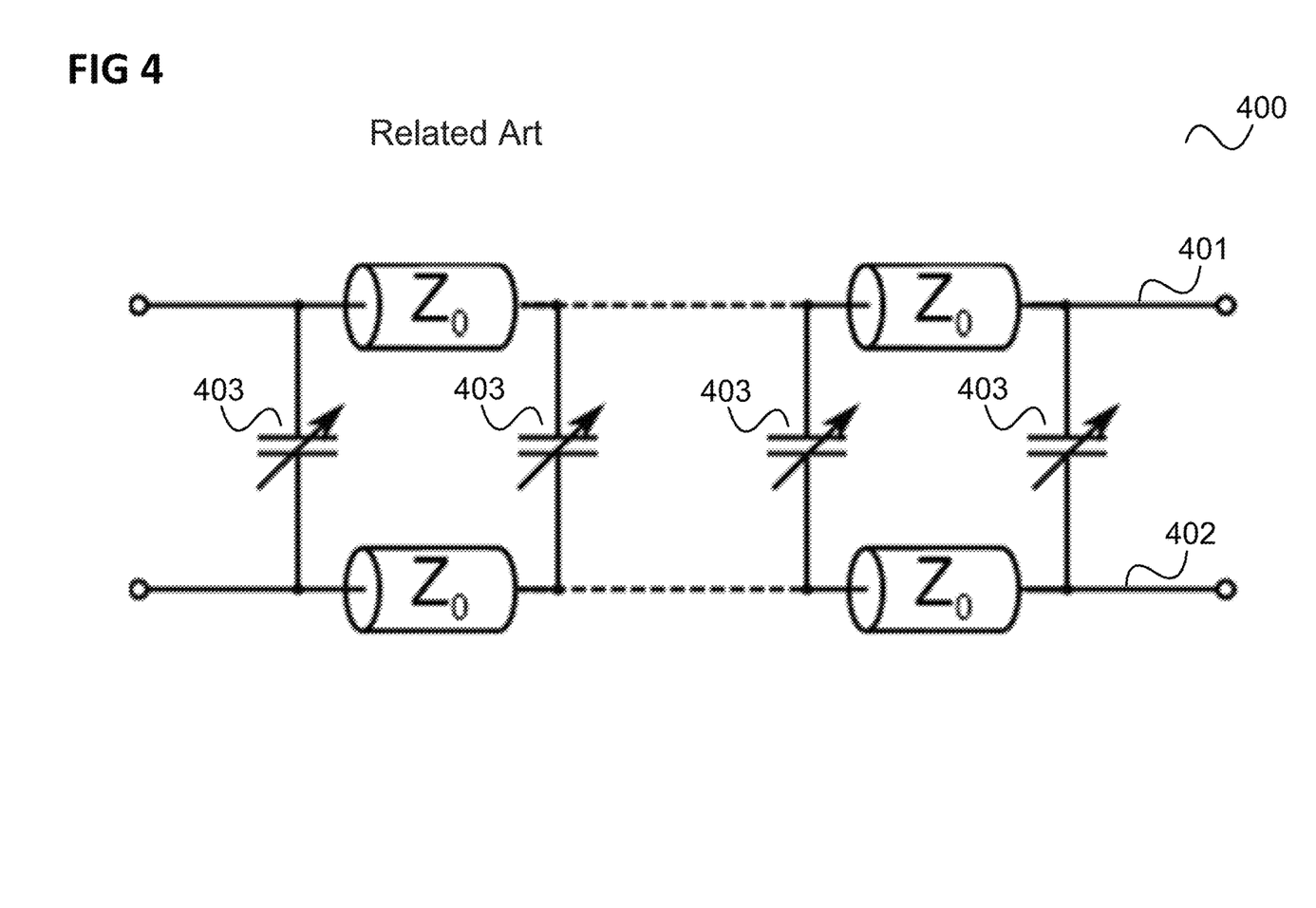
FIG. 4 shows a varactor-loaded transmission line which allows implementing an adjustable delay by means of varactors.

FIG. 4 shows a varactor-loaded transmission line 400 which allows implementing an adjustable delay (true time delay (TTD)) by means of varactors 403.

The delay line comprises a first conductor 401 and a second conductor 402 (having a characteristic impedance $Z_0$) and the varactors 403 are connected between the first conductor 401 and the second conductor 402.

Due to its distributed nature, the implementation of the delay line 400 typically results in being quite large and lossy. To improve the insertion loss and reduce the occupied area, a lumped version of the transmission line can be used as shown in FIG. 5.

Figure 5:
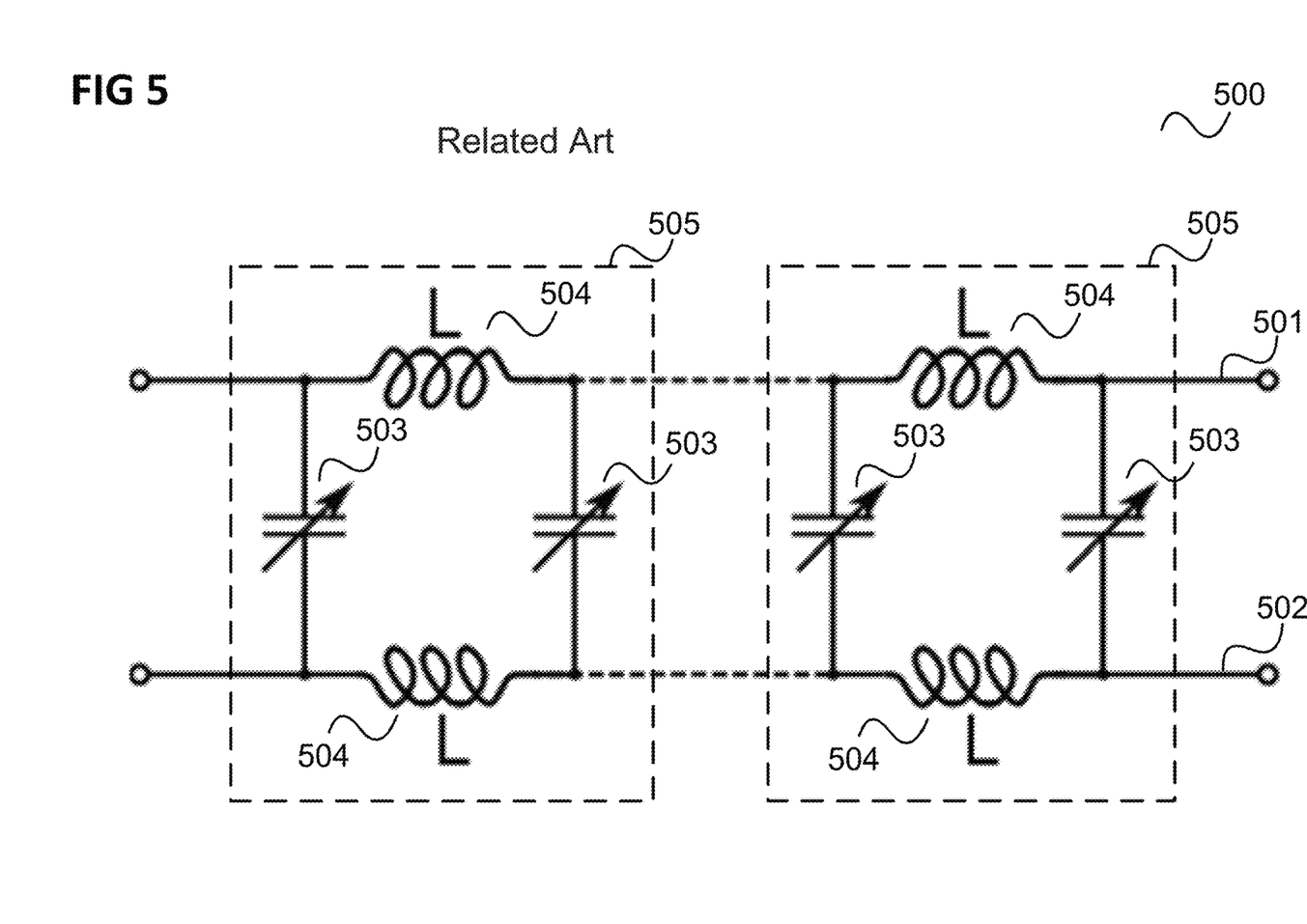
FIG. 5 shows a lumped-element varactor-loaded transmission line illustrating another example for a wideband implementation.

FIG. 5 shows a delay line 500 illustrating another example for a wideband TTD implementation.

The delay line 500 comprises a first conductor 501 and a second conductor 502 and varactors 503 coupled between the first conductor 501 and the second conductor 502. In contrast to the delay line 400, inductors 504 are provided in the conductors 501, 502 wherein one inductor 504 of each conductor 501, 502 and the two varactors 503 arranged to the left and right of the inductors 504 form an LC cell 505.

Even in this case, however, a fully differential implementation requires two stand-alone inductors 504 for each cell 505, making it difficult to realize a large on-chip variable delay. An active gm-RC solution can also be implemented, which however suffers from featuring a large power consumption and a relatively low linearity. Another alternative, is to realize a phase shift instead of a time delay shift. This solution leads, however, to a huge performance penalty and a system limitation.

In the following, an approach is described according to which a transformer (or coupled inductors) are used to realize the two inductors of each cell. This is illustrated in FIG. 6.

Figure 6:
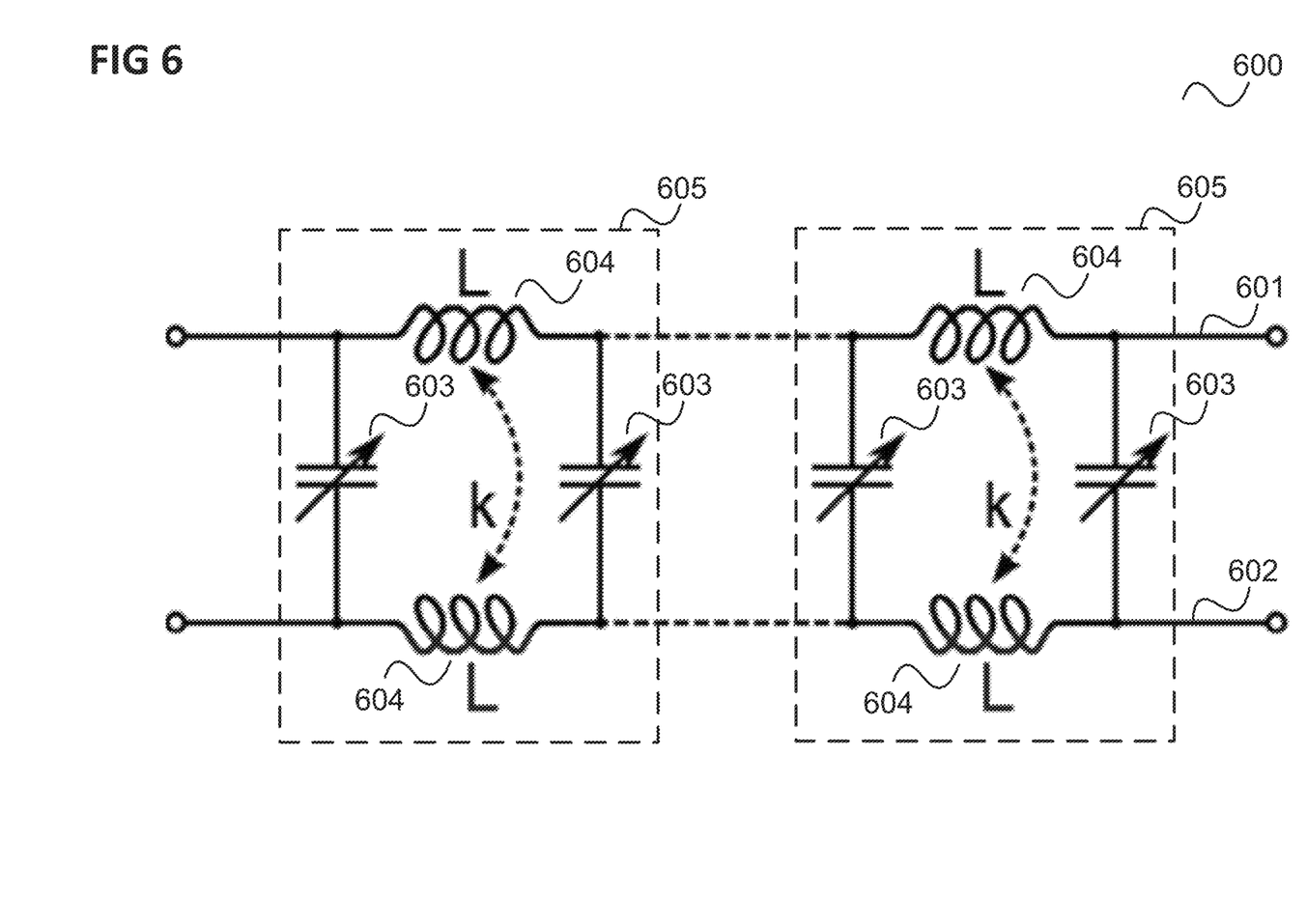
FIG. 6 shows a lumped-element varactor-loaded transmission line illustrating a more efficient example for a wideband true time delay implementation.

FIG. 6 shows a delay line 600 illustrating another example for a wideband TTD implementation.

The delay line 600 comprises a first conductor 601 and a second conductor 602 and varactors 603 coupled between the first conductor 601 and the second conductor 602. Further, inductors 604 are provided in the conductors 601, 602 wherein one inductor 604 of each conductor 601, 602 and the two varactors 603 arranged to the left and right of the inductors 604 form an LC cell 605. In contrast to the example of FIG. 5, the inductors 604 of one LC cell 605 are (strongly) magnetically coupled with a coupling factor k, by having overlapping inductor areas (e.g. by stacking them on top of each other).

Thus, the differential-mode inductance for each conductor is $L*(1+k)$ wherein L is the inductance of an inductor 604, which means that each inductor (e.g. coil) could be smaller than in the implementation of FIG. 5, which allows saving area. Each cell 605 can be seen to form a transformer comprising a set of totally or partially overlapped inductors. It is intrinsically smaller than a set of two independent inductors, again allowing saving area.

Furthermore, for the same quality factor for the coils, the transformer-based approach of FIG. 6 allows an improvement of the insertion loss (with respected to the approaches of FIGS. 4 and 5) thanks to the mutual energy stored into the transformer leading to a better performance.

Figure 7:
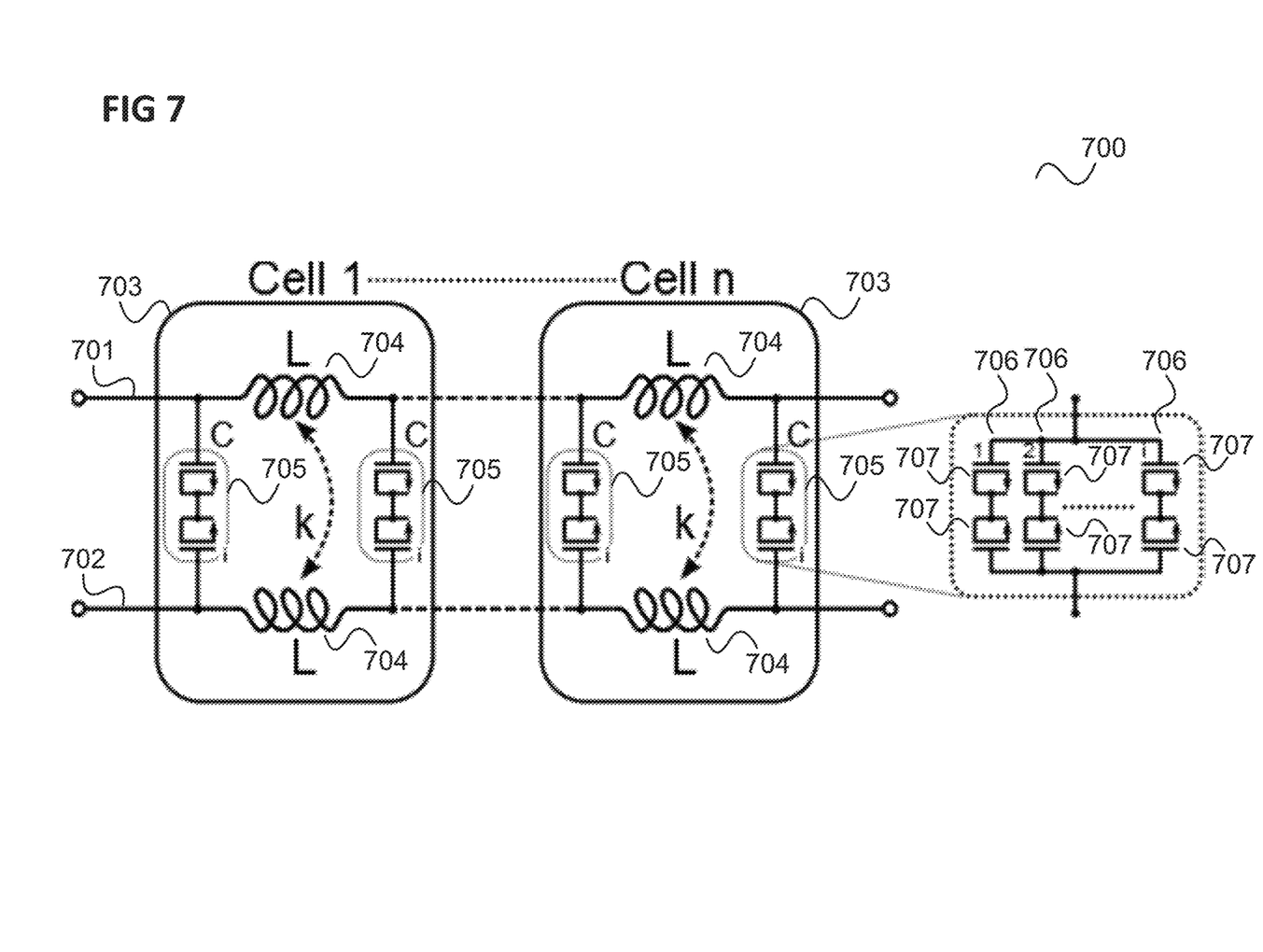
FIG. 7 shows an example of an implementation of a delay line.

FIG. 7 shows an example of an implementation of a True Time Delay 700 (e.g. in BiCMOS technology).

The delay line 700 comprises a cascade of several cells 703, each comprising for a first conductor 701 and a second conductor 702 and an inductor 704, wherein the inductors 704 which are magnetically coupled to form a transformer. On each side of the inductors 704, there is a MOS varactor 705 allowing to implement a variable delay of the cells 703. The size of the transformer together with the maximum capacitance of the varactors 705 sets the maximum time delay as well as the characteristic impedance of the cells. The varactors 705 are in this example sliced in a number of i parallel slices, wherein each slice 706 comprises two MOS varactors 707 which are connected together with their source and drains and of which one is connected to the first conductor 701 with its gate terminal and the other is connected to the second conductor 702 with its gate terminal. The MOS varactors 707 are connected in a digital way to avoid a highly non-linear C-V characteristic. For example, each MOS varactor 707 of one cell 703 is controlled by a different digital bit which is connected directly to the drain/source of the MOSFET structure implementing the MOS varactor 707.

This allows, furthermore, to increase the delay resolution of the cells 703. The total variable delay of the structure is n*Tc, where n is the number of cascaded cells 703 and Tc is the variable delay offered by a single cell 703.

Figure 8:
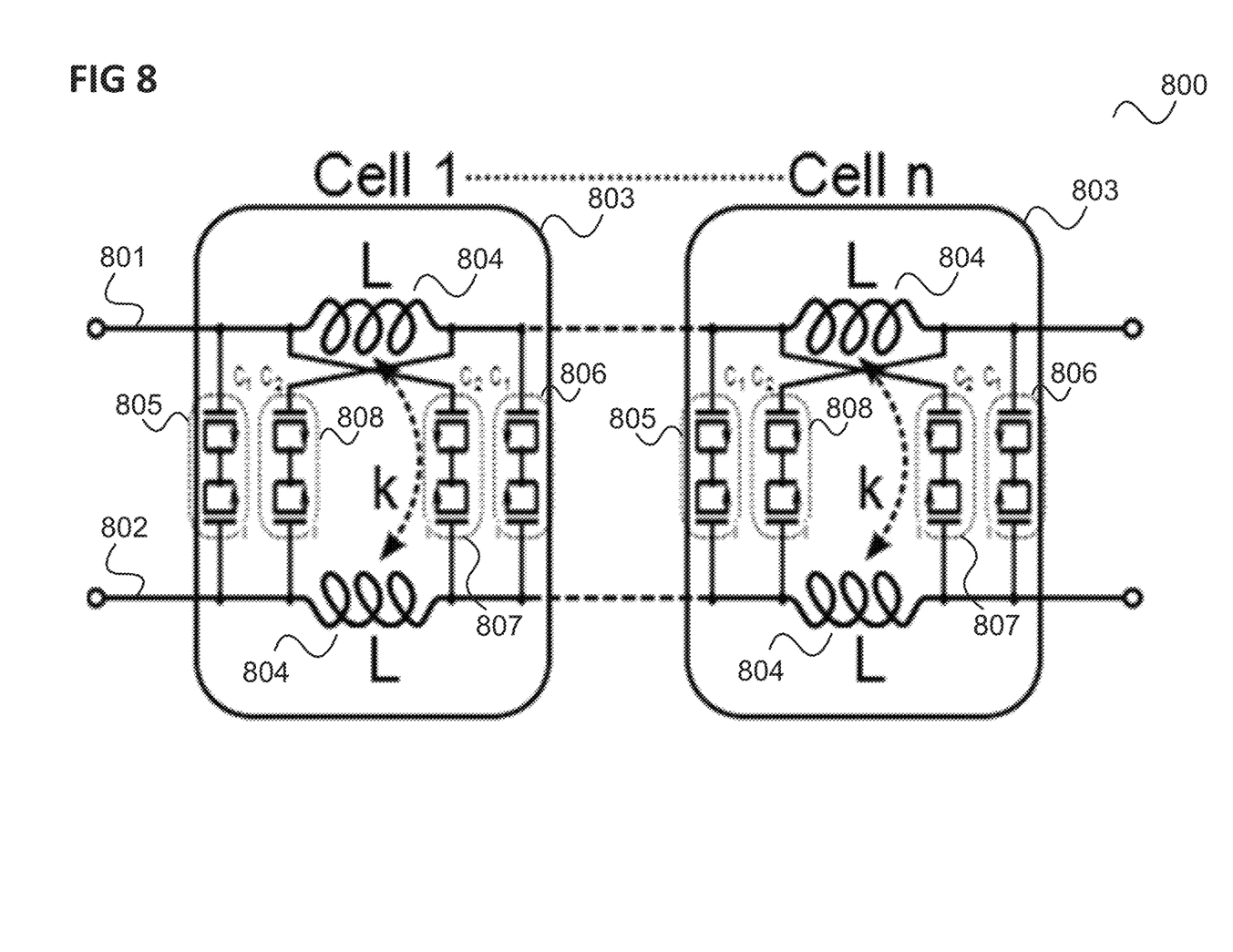
FIG. 8 shows another example of an implementation of a delay line.

FIG. 8 shows another example of an implementation of a True Time Delay 800.

Similarly to the delay line 700, the delay line 800 comprises a cascade of several cells 803, each comprising for a first conductor 801 and a second conductor 802 and an inductor 804 wherein the inductors 804 are magnetically coupled.

In this example, each cell 803 is a combination of an LC ladder cell and an all pass network, i.e. is a hybrid cell. Specifically, each cell 803 comprises a first varactor 805 and a second varactor 806 coupled between the conductors 801, 802 at the left side and the right side of the inductors 804, respectively.

Further, each cell 803 comprises a third varactor 807 coupled between the left hand side (i.e. the input side) of the inductor 804 of the first conductor 801 and the right hand side (i.e. the output side) of the inductor 804 of the second conductor 802 and a fourth varactor 808 coupled between the right hand side of the inductor 804 of the first conductor 801 and the left hand side of the inductor 804 of the second conductor 802.

Figure 9:
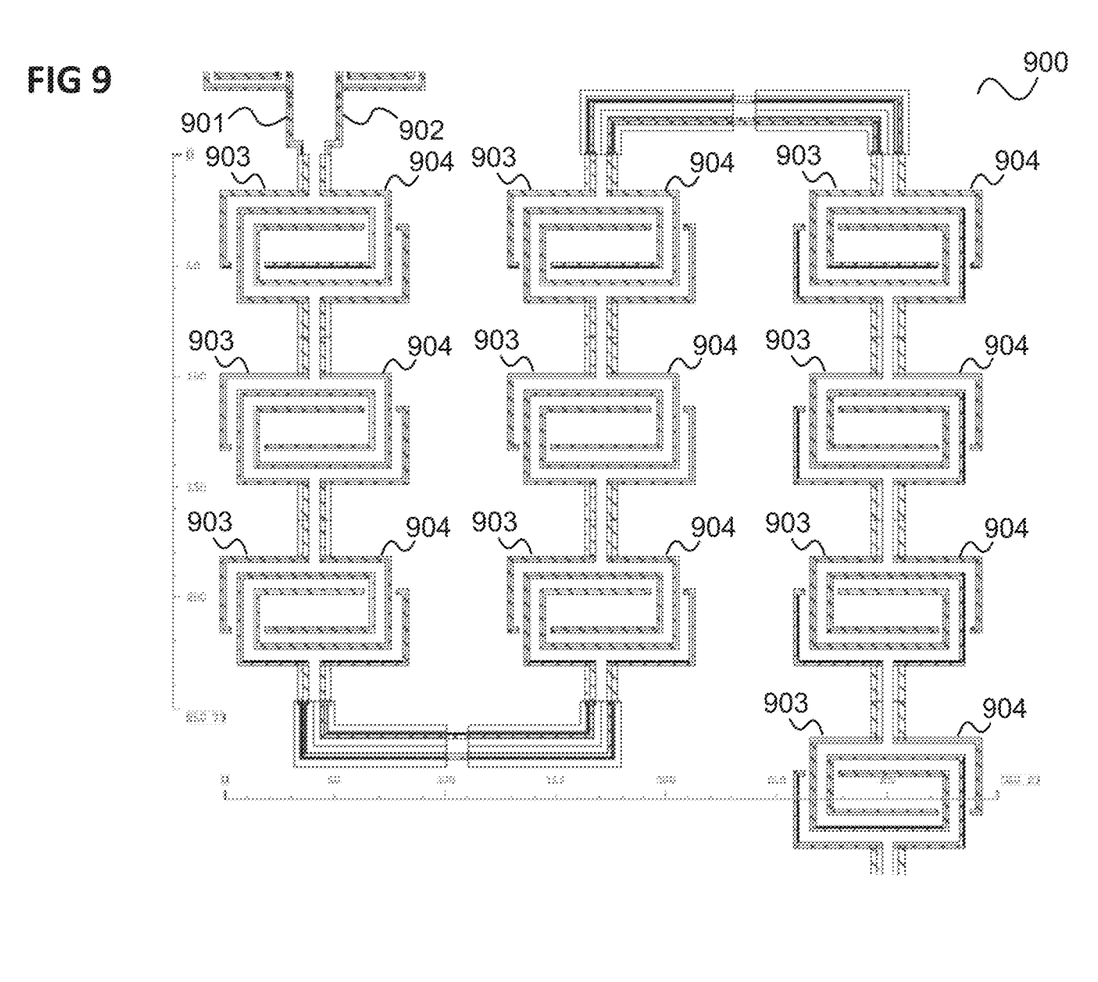
FIG. 9 shows an example implementation of a delay line on a chip.

FIG. 9 shows an example implementation of a delay line 900 on a chip.

The delay line comprises a first (left) conductor 901 and a second (right) conductor 902, formed as strip lines or metal tracks. The first conductor 901 is formed to form first inductors 903 and the second conductor 902 is formed to form second inductors 904, wherein the first inductors 903 form inductor pairs with the second inductors 904 such that the inductor area of the first inductor 903 of a pair overlaps with the second inductor 904 of a pair. The overlapping of the inductor areas is achieved by an intersection (i.e. a partial overlapping) of the conductors 901, 902, i.e. there are regions in which one conductor 901, 902 is above the other conductor 901, 902 to form the inductor coils. For example, in this regions, the coils are formed by different metal layers. In other regions, where the conductors 901, 902 are not on top of each other, they may be arranged in the same metal layer (e.g. in a parallel fashion on the chip). Alternatively, the inductors 903, 904 could also be stacked on top of each other.

Varactors may be placed directly between two consecutive transformers underneath their connection (and can therefore not be seen in FIG. 9).

Thus, each inductor pair can be seen to form a transformer, i.e. the delay line can be seen to be implemented as a sequence of transformers.

The delay line 900 allows, with a size slightly bigger than 350 um×250 um to achieve 15 ps delay.

Figure 10:
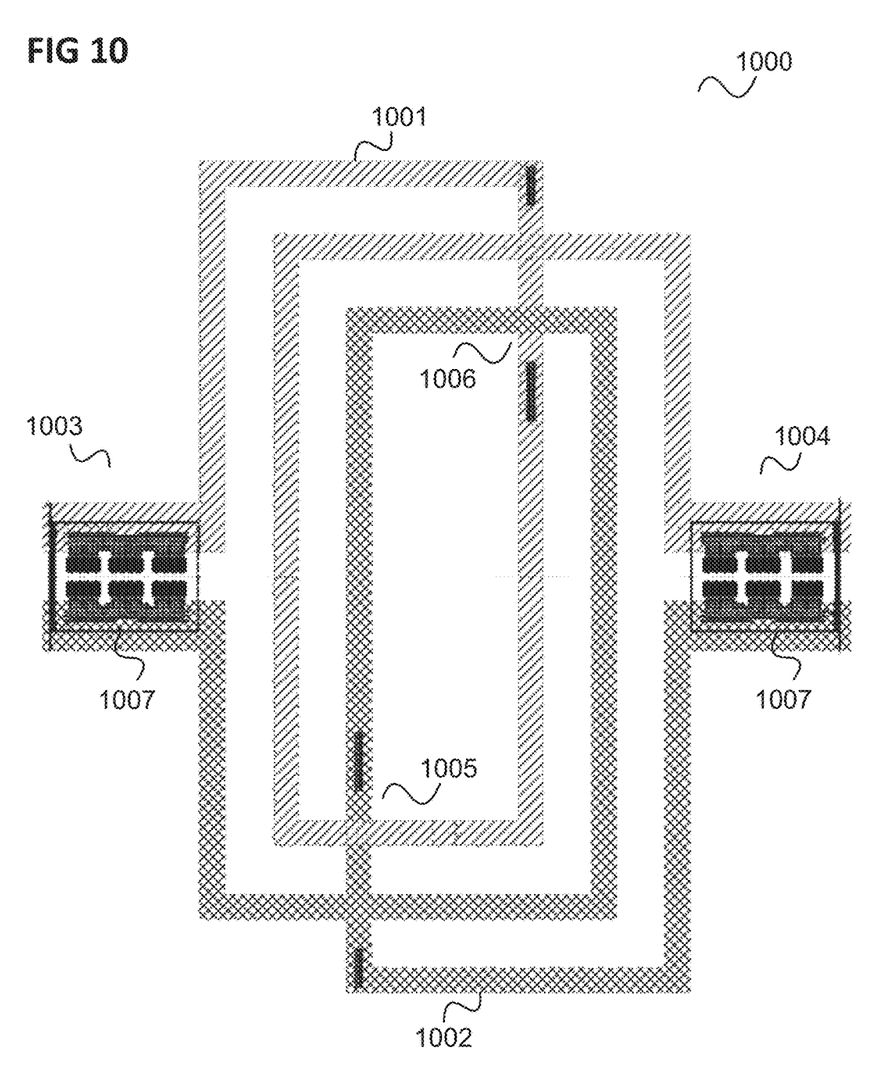
FIG. 10 shows a radio frequency delay line according to an embodiment.

FIG. 10 shows an example for an implementation of a transformer 1000 in a delay line of a chip.

The transformer 1000 is implemented by a first conductor 1001 (top conductor in FIG. 10) which forms a coil with 1.5 turns between an input side 1003 and an output side 1004 of the transformer and a second conductor 1002 (bottom conductor in FIG. 10) which also forms a coil with 1.5 turns between the input side 1003 and the output side 1004. The area enclosed by the coil formed by the first conductor 1001 and the area enclosed by the coil formed by the second conductor 1002 overlap. It should be noted that the areas only partially overlap. A full inductor overlap is possible, but requires that the two coils are made by different metal layers, i.e. not the identical metal layer. The two inductors may be formed by the best metal included in the respective technology. As can be seen, there is a first underpass 1005 (of the second conductor 1002) and a second underpass 1006 (of the first conductor 1001). These allow the two inductors to be identically formed. Alternatively, overpasses may be used. The first underpass 1005 and the second underpass 1006 are arranged not at the end of the respective coil but in a middle section. This allows to have a bigger last-turn, that means that the last piece of metal is responsible also to increase the overall inductance and not only the resistive part.

Both at the input side 1003 and at the output side 1004, varactor structures 1007 (e.g. including a plurality of MOS varactors as described above) are coupled between the first conductor 1001 and the second conductor 1002.

The conductors 1001, 1002 may also form coils with more turns, e.g. n+0.5 turns where n is an integer. This allows a simple interconnection of the varactors and a simple cell-to-cell interconnection.

Figure 11:
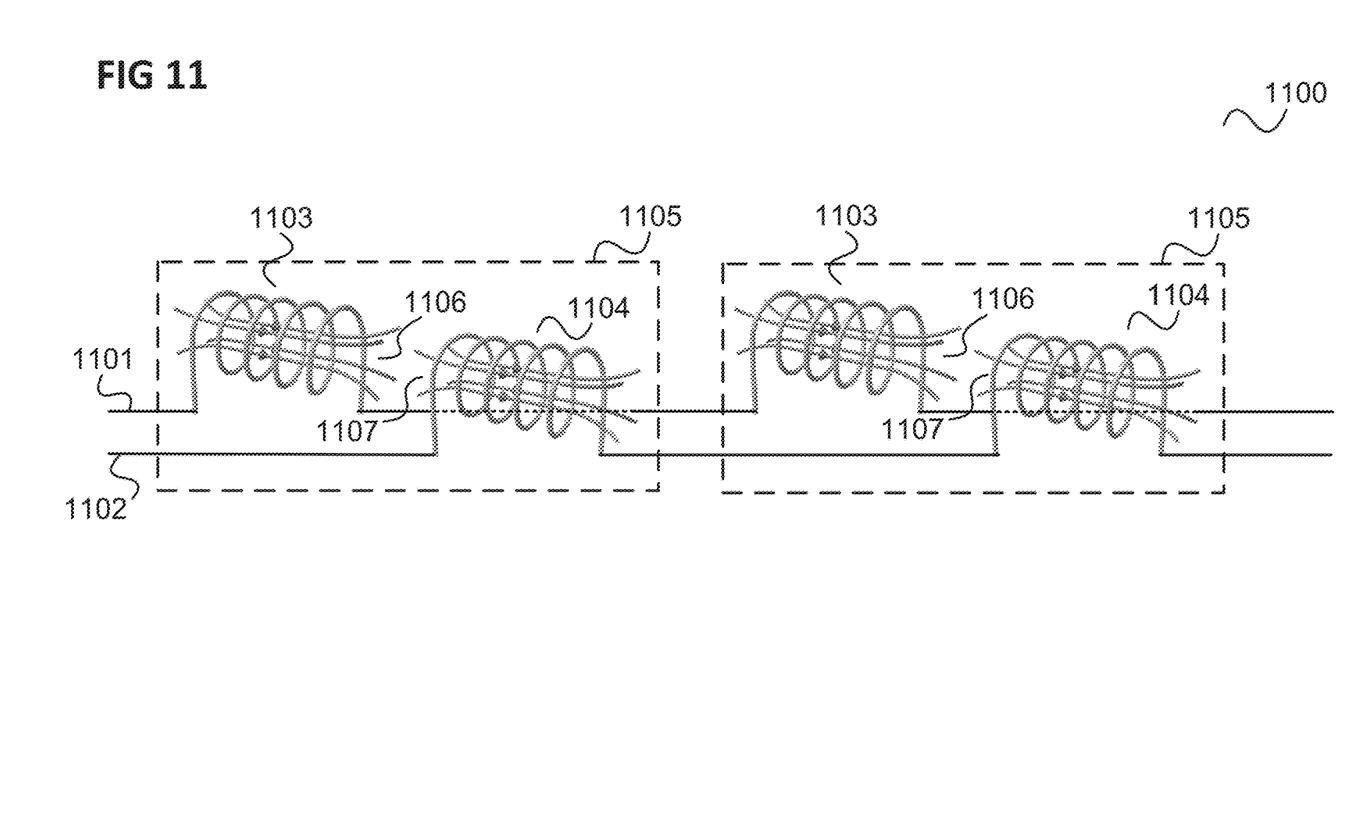
FIG. 11 shows a radio frequency delay line according to an embodiment.

In summary, according to various embodiments, a radio frequency delay line is provided as illustrated in FIG. 11.

FIG. 11 shows a radio frequency delay line 1100 according to an embodiment.

The radio frequency delay line 1100 comprises a first conductor 1101 comprising a plurality of first inductors 1103, a second conductor 1102 comprising a plurality of second inductors 1104, wherein each of the plurality first inductors corresponds to a respective one of the plurality of second inductors a plurality of inductor pairs 1105, each inductor pair 1105 comprising a first inductor 1103 and the corresponding second inductor 1104.

For each of the plurality of inductor pairs, the first inductor 1103 and the corresponding second inductor 1104 are arranged so that an inductor area of the first inductor 1106 overlaps with an inductor area of the corresponding second inductor 1107.

According to various embodiments, in other words, a plurality of transformers are provided in a delay line to realize a fully differential true time delay, allowing implementation with a small occupied area and low insertion loss. Each transformer is realized by two magnetically coupled inductors whose high magnetic coupling is achieved by arranging them to have overlapping inductor areas wherein the inductor area (or coil area) of an inductor is understood by the area enclosed by the inductor coil. The overlapping of inductor areas means that at least a part of the magnetic field lines (as illustrated in FIG. 11) which traverse the inside of one of the magnetically coupled inductors also traverses the inside of the other one of the magnetically coupled inductors.

The higher the coupling factor, the better the performance. Hence, it depends also on the transformer layout: to reach higher frequencies, the transformer must be small, and hence also the coupling between primary and secondary could not be that high. As an example, for a 10 GHz application, a transformer with a coupling factor of e.g. about 0.5 may be used. For a 30 GHz application, a coupling factor of for example about 0.3 may be used.

It should be noted that a delay line as illustrated in FIG. 11 is not limited to a particular technology but may for example be implemented in CMOS (Complementary Metal Oxide Semiconductor), Bipolar, BiCMOS, SOI (Silicon On Insulator) and other technologies. Further, the approach of FIG. 6 is not limited to any size or topology or shape of the transformer.

The delay line as illustrated in FIG. 11 may for example be used in radar applications or for communication, e.g. in communication networks, at various frequency, e.g. at 10 GHz or in Millimeter wave spectrum, e.g. at 30 GHz.

Various Examples are described in the following:

Example 1 is a radio frequency delay line as illustrated in FIG. 11.

Example 2 is the radio frequency delay line of Example 1, wherein the plurality of first conductors forms a first serial connection of inductors and the plurality of second conductors forms a second serial connection of inductors.

Example 3 is the radio frequency delay line of Example 1 or 2, being a differential delay line.

Example 4 is the radio frequency delay line of any one of Examples 1 to 3, wherein the first conductor and the second conductor are wires or strip lines.

Example 5 is the radio frequency delay line of any one of Examples 1 to 4, wherein for each inductor pair, a section of a line forming the first inductor overlaps with a section of a line forming the second inductor.

Example 6 is the radio frequency delay line of any one of Examples 1 to 5, wherein the first conductor forms the first inductors and the second conductor forms the second inductors.

Example 7 is the radio frequency delay line of any one of Examples 1 to 6, wherein for each of the inductor pairs, the inductor area of the first inductor overlaps with the inductor area of the corresponding second inductor by at least 20%, by at least 30%, by at least 40%, by at least 50%, by at least 60%, by at least 80% or by at least 90%.

Example 8 is the radio frequency delay line of any one of Examples 1 to 7, being a millimeter wave radio or a radar signal delay line.

Example 9 is the radio frequency delay line of any one of Examples 1 to 8, comprising a plurality of capacitors coupled between the first conductor and the second conductor.

Example 10 is the radio frequency delay line of Example 9, wherein the capacitors are varactors.

Example 11 is the radio frequency delay line of Example 10, wherein each capacitor is a MOS varactor, a bipolar varactor or a switched capacitor.

Example 12 is the radio frequency delay line of Example 9, wherein the capacitors are analogously or digitally adjustable.

Example 13 is the radio frequency delay line of any one of Examples 1 to 12, wherein each of the plurality of capacitors is coupled between a node of the first conductor lying between two of the first inductors and a node of the second conductor lying between two of the second inductors.

Example 14 is the radio frequency delay line of any one of Examples 1 to 13, wherein each inductor pair forms a transformer cell.

Example 15 is the radio frequency delay line of Example 14, wherein for each inductor pair, the first inductor is formed by a coil of the first conductor comprising n+0.5 turns and the second inductor is formed by a coil of the second conductor comprising n+0.5 turns where n is an integer.

Example 16 is the radio frequency delay line of Example 14 or 15, wherein for each inductor pair, the first inductor is formed by a coil of the first conductor and the second inductor is formed by a coil of the second conductor, wherein the coil of the first conductor and the coil of the second conductor are identically formed.

Example 17 is the radio frequency delay line of any one of Examples 14 to 16, wherein for each inductor pair, the first inductor is formed by a coil of the first conductor and the second inductor is formed by a coil of the second conductor, wherein the coil of the first conductor and the coil of the second conductor are formed by the same metal layer of a chip.

Example 18 is the radio frequency delay line of any one of Examples 14 to 17, wherein for each inductor pair, the first inductor is formed by a coil of the first conductor and the second inductor is formed by a coil of the second conductor, wherein the coil of each inductor passes under, over, or both, the coil formed by the respective other inductor at one or more points arranged at middle sections of the coil formed by the first conductor or the coil formed by the second conductor.

Example 19 is the radio frequency delay line of any one of Examples 14 to 18, wherein the transformer cell comprises one or more MOS varactors coupled between the first conductor and the second conductor.

Example 20 is the radio frequency delay line of any one of Examples 1 to 19, wherein for each inductor pair, the coupling factor of the first inductor and the second inductor is above 0.20, above 0.3 or above 0.5.

Example 21 is a delay line arrangement comprising a radio frequency delay line of any one of Examples 1 to 20, further comprising an antenna coupled to the delay line.

Example 22 is the delay line arrangement of Example 21, further comprising an amplifier, wherein the delay line is coupled to the antenna via the amplifier.

Example 23 is the delay line arrangement of Example 21 or 22, comprising a plurality of radio frequency delay lines of any one of Examples 1 to Example 20.

According to a further example, a delay line is provided comprising a first conductor comprising a plurality of first inductors, a second conductor comprising, for each first inductor of the first conductor, a second inductor forming an inductor pair with the first inductor of the first conductor, wherein, for each inductor pair, the first inductor and the second inductor are arranged so that the inductor area of the first inductor overlaps with the inductor area of the second inductor.

According to an even further example, a delay line is provided comprising a sequence of transformers, wherein each transformer is formed by two inductors with overlapping inductor area.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A radio frequency delay line comprising:
   a first conductor comprising a plurality of first inductors;
   a second conductor comprising a plurality of second inductors, wherein each of the plurality of first inductors corresponds to a respective one of the plurality of second inductors;
   a plurality of inductor pairs, each inductor pair comprising a first inductor of the plurality of first inductors and a corresponding second inductor of the plurality of second inductors;
   wherein for each of the plurality of inductor pairs, the first inductor and the corresponding second inductor are arranged so that an inductor area of the first inductor overlaps with an inductor area of the corresponding second inductor;
   wherein for each of the inductor pairs, the inductor area of the first inductor overlaps with the inductor area of the corresponding second inductor by at least 20%.

2. The radio frequency delay line of claim 1, wherein the plurality of first inductors forms a first serial connection of inductors and the plurality of second inductors forms a second serial connection of inductors.

3. The radio frequency delay line of claim 1, being a differential delay line.

4. The radio frequency delay line of claim 1, wherein the first conductor and the second conductor are wires or strip lines.

5. The radio frequency delay line of claim 1, wherein for each inductor pair, a section of a line forming the first inductor overlaps with a section of a line forming the second inductor.

6. The radio frequency delay line of claim 1, wherein the first conductor forms the plurality of first inductors and the plurality of second conductor forms the second inductors.

7. The radio frequency delay line of claim 1, wherein for each inductor pair, the coupling factor of the respective first inductor and the corresponding second inductor is above 0.20, above 0.3 or above 0.5.

8. The radio frequency delay line of claim 1, being a millimeter wave radio or a radar signal delay line.

9. The radio frequency delay line of claim 1, comprising a plurality of capacitors coupled between the first conductor and the second conductor.

10. The radio frequency delay line of claim 9, wherein the plurality of capacitors are varactors.

11. The radio frequency delay line of claim 9, wherein each capacitor is a MOS varactor, a bipolar varactor or a switched capacitor.

12. The radio frequency delay line of claim 9, wherein the capacitors are analogously or digitally adjustable.

13. The radio frequency delay line of claim 9, wherein each of the plurality of capacitors is coupled between a respective node of the first conductor lying between two of the first inductors and a node of the second conductor lying between two of the first inductors and a corresponding node of the second conductor.

14. The radio frequency delay line of claim 1, wherein each inductor pair forms a respective transformer cell.

15. The radio frequency delay line of claim 14, wherein for each inductor pair, the respective first inductor is formed by a coil of the first conductor comprising n+0.5 turns and the corresponding second inductor is formed by a coil of the second conductor comprising n+0.5 turns where n is an integer.

16. The radio frequency delay line of claim 14, wherein for each inductor pair, the respective first inductor is formed by a coil of the first conductor and the corresponding second inductor is formed by a coil of the second conductor, wherein the coil of the first conductor and the coil of the second conductor are identically formed.

17. The radio frequency delay line of claim 14, wherein for each inductor pair, the respective first inductor is formed by a coil of the first conductor and the corresponding second inductor is formed by a coil of the second conductor, wherein the coil of the first conductor and the coil of the second conductor are formed by the same metal layer of a chip.

18. The radio frequency delay line of claim 14, wherein for each inductor pair, the respective first inductor is formed by a coil of the first conductor and the second inductor is formed by a coil of the corresponding second conductor, wherein the coil of each inductor passes under, over, or both, the coil formed by the respective other inductor at one or more points arranged at middle sections of the coil formed by the first conductor or the coil formed by the second conductor.

19. The radio frequency delay line of claim 14, wherein the respective transformer cell comprises one or more MOS varactors coupled between the first conductor and the second conductor.

20. A delay line arrangement comprising a radio frequency delay line of claim 1, further comprising an antenna coupled to the delay line.

21. The delay line arrangement of claim 20, further comprising a plurality of the radio frequency delay lines.

22. The delay line arrangement of claim 20, further comprising an amplifier, wherein the delay line is coupled to the antenna via the amplifier.

\* \* \* \* \*